(12) United States Patent
King et al.

(10) Patent No.: US 6,788,193 B2
(45) Date of Patent: Sep. 7, 2004

(54) SYSTEM AND METHOD FOR TIRE PRESSURE MONITORING PROVIDING AUTOMATIC TIRE LOCATION RECOGNITION

(75) Inventors: Ronald O. King, Brownstown, MI (US); Qingfeng Tang, Novi, MI (US); John S. Nantz, Brighton, MI (US); Bruce Conner, Ann Arbor, MI (US); Keith Walker, Redford, MI (US)

(73) Assignee: Lear Corporation, Southfield, MI (US)

( * ) Notice: Subject to any disclaimer, the term of this patent is extended or adjusted under 35 U.S.C. 154(b) by 47 days.

(21) Appl. No.: 10/217,760

(22) Filed: Aug. 12, 2002

(65) Prior Publication Data

US 2003/0164758 A1 Sep. 4, 2003

Related U.S. Application Data
(60) Provisional application No. 60/367,191, filed on Mar. 25, 2002, and provisional application No. 60/360,762, filed on Mar. 1, 2002.

(51) Int. Cl.[7] ............................................. B60C 23/00
(52) U.S. Cl. ...................... 340/447; 340/442; 340/444; 340/445; 73/146
(58) Field of Search .............................. 340/447, 442, 340/443, 444, 445; 73/146, 146.2, 146.4, 146.5

(56) References Cited

U.S. PATENT DOCUMENTS

| | | | |
|---|---|---|---|
| 3,580,353 A | 5/1971 | Thompson | |
| 3,723,966 A | 3/1973 | Mueller et al. | |
| 3,916,688 A | 11/1975 | Dendy et al. | |
| 4,067,235 A | 1/1978 | Markland et al. | |
| 4,101,870 A | 7/1978 | Ekman | |
| 4,330,774 A | 5/1982 | Doty | |
| 4,450,431 A | 5/1984 | Hochstein | |
| 4,468,650 A | 8/1984 | Barbee | |
| 4,570,152 A | 2/1986 | Melton et al. | |
| 4,609,905 A | 9/1986 | Uzzo | |
| 4,660,528 A | 4/1987 | Buck | |
| 4,670,845 A | 6/1987 | Etoh | |
| 4,684,853 A | 8/1987 | Coash | |
| 4,717,905 A | 1/1988 | Morrison, Jr. et al. | |
| 4,749,993 A | 6/1988 | Szabo et al. | |
| 4,761,830 A | 8/1988 | Izumi | |
| 4,951,208 A | 8/1990 | Etoh | |

(List continued on next page.)

FOREIGN PATENT DOCUMENTS

| | | |
|---|---|---|
| EP | 0 016 991 A | 10/1980 |
| EP | 0 646 985 A1 | 4/1995 |
| EP | 0 753 897 A2 | 1/1997 |
| EP | 0 760 299 A1 | 3/1997 |
| EP | 1059177 | 12/2000 |
| EP | 1 113 582 A2 | 7/2001 |

(List continued on next page.)

OTHER PUBLICATIONS

UK Search Report dated Jun. 4, 2003.

Primary Examiner—Toan N. Pham
(74) Attorney, Agent, or Firm—Bill C. Panagos

(57) ABSTRACT

In a system for remote monitoring of tire pressure in a vehicle having front tires including a right tire and a left tire, and rear tires including a right tire and a left tire, a system and method are provided for automatically identifying tire location. A transmitters mounted in each tire transmits tire information signals conveying tire pressure data and associated tire rotation direction data. A vehicle mounted receiver has a location a first distance from the front tires and a second distance from the rear tires, the first distance being different from the second. A vehicle mounted controller in communication with the receiver determines whether pressure data is associated with a front tire or a rear tire based on the strength of the tire information signal, and whether pressure data is associated with a right tire or a left tire based on the associated rotation direction data.

20 Claims, 2 Drawing Sheets

U.S. PATENT DOCUMENTS

| | | |
|---|---|---|
| 5,040,561 A | 8/1991 | Achterholt |
| 5,109,213 A | 4/1992 | Williams |
| 5,156,230 A | 10/1992 | Washburn |
| 5,165,497 A | 11/1992 | Chi |
| 5,289,160 A | 2/1994 | Fiorletta |
| 5,444,448 A | 8/1995 | Schuermann et al. |
| 5,451,959 A | 9/1995 | Schuermann |
| 5,461,385 A | 10/1995 | Armstrong |
| 5,463,374 A | 10/1995 | Mendez et al. |
| 5,473,938 A | 12/1995 | Handfield et al. |
| 5,479,171 A | 12/1995 | Schuermann |
| 5,483,827 A | 1/1996 | Kulka et al. |
| 5,485,381 A | 1/1996 | Heintz et al. |
| 5,500,637 A | 3/1996 | Kokubu |
| 5,515,014 A | 5/1996 | Troutman |
| 5,531,109 A | 7/1996 | Tsagas |
| 5,562,787 A | 10/1996 | Koch et al. |
| 5,573,610 A | 11/1996 | Koch et al. |
| 5,573,611 A | 11/1996 | Koch et al. |
| 5,585,554 A | 12/1996 | Handfield et al. |
| 5,600,301 A | 2/1997 | Robinson, III |
| 5,602,524 A | 2/1997 | Mock et al. |
| 5,612,671 A * | 3/1997 | Mendez et al. ............ 340/447 |
| 5,654,689 A | 8/1997 | Peyre et al. |
| 5,661,651 A | 8/1997 | Geschke et al. |
| 5,677,667 A | 10/1997 | Lesesky et al. |
| 5,705,746 A | 1/1998 | Trost et al. |
| 5,717,376 A | 2/1998 | Wilson |
| 5,724,028 A | 3/1998 | Prokup |
| 5,728,933 A | 3/1998 | Schultz et al. |
| 5,740,548 A | 4/1998 | Hudgens |
| 5,741,966 A | 4/1998 | Handfield et al. |
| 5,753,809 A | 5/1998 | Ogusu et al. |
| 5,760,682 A | 6/1998 | Liu et al. |
| 5,774,047 A | 6/1998 | Hensel, IV |
| 5,783,992 A | 7/1998 | Eberwine et al. |
| 5,822,683 A | 10/1998 | Paschen |
| 5,835,868 A | 11/1998 | McElroy et al. |
| 5,838,229 A | 11/1998 | Robinson, III |
| 5,844,130 A | 12/1998 | Hilgart et al. |
| 5,853,020 A | 12/1998 | Widner |
| 5,880,363 A | 3/1999 | Meyer et al. |
| 5,883,305 A | 3/1999 | Jo et al. |
| 5,900,808 A | 5/1999 | Lebo |
| 5,920,234 A | 7/1999 | Hill |
| 5,926,087 A | 7/1999 | Busch et al. |
| 5,929,620 A | 7/1999 | Dobkin et al. |
| 5,939,977 A | 8/1999 | Monson |
| 5,942,971 A | 8/1999 | Fauci et al. |
| 5,959,365 A | 9/1999 | Mantini et al. |
| 5,963,128 A | 10/1999 | McClelland |
| 5,999,091 A | 12/1999 | Wortham |
| 6,002,327 A | 12/1999 | Boesch et al. |
| 6,025,777 A | 2/2000 | Fuller et al. |
| 6,034,596 A | 3/2000 | Smith et al. |
| 6,034,597 A | 3/2000 | Normann et al. |
| 6,043,738 A | 3/2000 | Stewart et al. |
| 6,043,752 A | 3/2000 | Hisada et al. |
| 6,053,038 A | 4/2000 | Schramm et al. |
| 6,060,984 A | 5/2000 | Braun et al. |
| 6,087,930 A | 7/2000 | Kulka et al. |
| 6,111,520 A | 8/2000 | Allen et al. |
| 6,112,587 A | 9/2000 | Oldenettel |
| 6,118,369 A | 9/2000 | Boesch |
| 6,127,939 A | 10/2000 | Lesesky et al. |
| 6,169,480 B1 | 1/2001 | Uhl et al. |
| 6,175,302 B1 | 1/2001 | Huang |
| 6,181,241 B1 | 1/2001 | Normann et al. |
| 6,204,758 B1 | 3/2001 | Wacker et al. |
| 6,232,875 B1 | 5/2001 | DeZorzi |
| 6,232,884 B1 | 5/2001 | Gabbard |
| 6,239,753 B1 | 5/2001 | Kado et al. |
| 6,243,007 B1 | 6/2001 | McLaughlin et al. |
| 6,246,317 B1 | 6/2001 | Pickornik et al. |
| 6,252,498 B1 | 6/2001 | Pashayan, Jr. |
| 6,255,940 B1 | 7/2001 | Phelan et al. |
| 6,259,361 B1 | 7/2001 | Robillard et al. |
| 6,259,362 B1 | 7/2001 | Lin |
| 6,275,148 B1 | 8/2001 | Takamura et al. |
| 6,278,363 B1 | 8/2001 | Bezek et al. |
| 6,292,095 B1 | 9/2001 | Fuller et al. |
| 6,304,610 B1 | 10/2001 | Monson |
| 6,340,929 B1 | 1/2002 | Katou et al. |
| 6,362,731 B1 * | 3/2002 | Lill ............................ 340/445 |
| 6,369,703 B1 * | 4/2002 | Lill ............................ 340/447 |
| 6,384,720 B1 * | 5/2002 | Juzswik et al. ............ 340/442 |
| 6,408,690 B1 | 6/2002 | Young et al. ............... 73/146.5 |
| 6,417,766 B1 | 7/2002 | Starkey |
| 6,441,728 B1 | 8/2002 | Dixit et al. |
| 6,489,888 B1 * | 12/2002 | Honeck et al. ............ 340/442 |
| 6,501,372 B2 | 12/2002 | Lin ............................ 340/442 |
| 6,518,877 B1 | 2/2003 | Starkey et al. |
| 6,571,617 B2 * | 6/2003 | Van Niekerk et al. ......... 73/146 |
| 6,581,449 B1 | 6/2003 | Brown et al. |
| 6,612,165 B2 | 9/2003 | Juzswik et al. |
| 2001/0008083 A1 | 7/2001 | Brown |
| 2003/0201879 A1 | 10/2003 | Munch et al. |

FOREIGN PATENT DOCUMENTS

| | | |
|---|---|---|
| EP | 1 172 236 | 1/2002 |
| EP | 1 211 104 A2 | 6/2002 |
| EP | 1 215 056 A2 | 6/2002 |
| EP | 1 262 339 A1 | 12/2002 |
| EP | 1 267 021 A1 | 12/2002 |
| EP | 1 215 056 A3 | 4/2003 |
| FR | 2801728 A | 6/2001 |
| GB | 1483735 | 8/1977 |
| GB | 2179480 A | 3/1987 |
| GB | 2318696 A | 4/1998 |
| GB | 2381972 A | 5/2003 |
| JP | 260212 A1 | 2/1990 |
| JP | 8244424 A | 9/1996 |
| JP | 10-107548 A | 4/1998 |
| JP | 2001-007712 A | 1/2001 |
| WO | WO 91/08614 | 6/1991 |
| WO | WO 96/15919 | 5/1996 |
| WO | WO 98/26946 | 6/1998 |
| WO | WO 01/26069 A1 | 4/2001 |
| WO | WO 01/69803 | 9/2001 |
| WO | WO 01/76007 A1 | 10/2001 |
| WO | WO 01/81104 A1 | 11/2001 |
| WO | WO 02/057097 | 7/2002 |
| WO | WO 02/072369 A1 | 9/2002 |

* cited by examiner

SYSTEM AND METHOD FOR TIRE PRESSURE MONITORING PROVIDING AUTOMATIC TIRE LOCATION RECOGNITION

CROSS REFERENCE TO RELATED APPLICATIONS

This application claims the benefit of U.S. provisional application Serial No. 60/360,762, filed Mar. 1, 2002, and U.S. provisional application Serial No. 60/367,191, filed Mar. 25, 2002.

BACKGROUND OF THE INVENTION

1. Field of the Invention

The present invention relates to a system and method for wireless vehicle tire pressure monitoring that provide for automatic recognition of tire location.

2. Background

It is known in the automotive industry to provide for wireless monitoring of vehicle tire parameters, particularly tire pressure. In such tire pressure monitoring systems, tire pressure sensors and radio frequency (RF) transmitters are mounted inside each tire, typically adjacent the inflation valve stem. In each tire, the tire pressure sensed by the tire pressure sensor is transmitted by the transmitter to a receiver/controller located on the vehicle. The tire pressure information delivered to the receiver/controller by the RF signals from the transmitters is subsequently conveyed to a vehicle operator or occupant, typically in the form of a display.

Exemplary tire pressure monitoring systems are described and shown in U.S. Pat. Nos. 6,112,587 and 6,034,597. To recognize the particular tire location (e.g., front left (FL), front right (FR), rear left (RL), rear right (RR)) associated with an RF signal received from a tire transmitter, such tire pressure monitoring systems are programmed in an initialization or sign-up operation. That is, in order to provide a vehicle operator with information specific to each vehicle tire, programming of the tire pressure monitoring system must be undertaken by a technician or vehicle owner so that each RF signal from a tire transmitter will be associated with a particular tire location.

Current tire pressure monitoring systems use a magnetic reed switch in each tire for such programming. More particularly, after the on-board vehicle/controller is placed into a program, initialization, or sign-up mode, the magnetic reed switch in each tire is activated by a technician or vehicle owner using a magnet. Such activation causes the tire transmitter in the tire to transmit a tire pressure signal to the controller the vehicle. In that regard, each pressure sensor and/or transmitter has a unique identification code associated therewith, which identification code is transmitted with the tire pressure signal. Using such identification codes, and by following a preselected sequence for activating each magnetic reed switch, the controller associates each tire pressure signal with a particular tire location.

Such operation, however, can create problems when tires are subsequently rotated or changed from their initial locations to new locations, or a vehicle tire is replaced. Each time the vehicle tires are rotated or a tire is replaced, initialization or sign-up must be repeated to ensure that the system continues to operate properly by conveying accurate information, including tire location, to the vehicle operator. This initialization requirement makes tire rotation more complex, and increases the possibility of inaccurate operation of the system. Moreover, in the event the magnet for activating the reed switches is misplaced or lost, the tire pressure monitoring system cannot be properly programmed after tire rotation.

Thus, there exists a need for an improved system and method for identifying tire locations in a tire pressure monitoring system. Such a system and method would automatically recognizes tire location even after tire rotation or replacement, without the need for subsequent initialization or sign-up operations. Such a system and method would also do so easily and simply, without adding significant costs to the tire pressure monitoring system.

SUMMARY OF THE INVENTION

Accordingly, the present invention provides an improved system and method for vehicle tire pressure monitoring that provide for automatic recognition of tire location.

According to the present invention, then, in a system for remote monitoring of tire pressure in a vehicle having front tires comprising a right tire and a left tire, and rear tires comprising a right tire and a left tire, a system is provided for automatically identifying tire location. The system comprises a plurality of transmitters, each transmitter for mounting in one of the tires, each transmitter for transmitting tire information signals conveying tire pressure data and tire rotation direction data associated therewith. The system further comprises a receiver for receiving the tire information signals transmitted by the transmitters, the receiver for mounting on the vehicle at a location having a first distance from the front tires and a second distance from the rear tires, the first distance different from the second distance. The system still further comprises a controller for mounting on the vehicle and to be provided in communication with the receiver, the controller for determining whether pressure data conveyed by a tire information signal is associated with a front tire or a rear tire based on a strength of the signal, and for determining whether pressure data conveyed by a tire information signal is associated with a right tire or a left tire based on the associated rotation direction data.

Also according to the present invention, in a system for remote monitoring of tire pressure in a vehicle having front tires comprising a right tire and a left tire, and rear tires comprising a right tire and a left tire, a method is provided for automatically identifying tire location. The method comprises transmitting from each tire pressure data and rotation direction data associated therewith, and receiving at a selected location on the vehicle the pressure data and rotation direction data. The method further comprises determining whether pressure data is associated with a front tire or a rear tire based on a strength of a signal conveying the pressure data, and determining whether pressure data is associated with a right tire or a left tire based on the associated rotation direction data.

These and other features and advantages of the present invention will be readily apparent upon consideration of the following detailed description of the invention in conjunction with the accompanying drawings.

DETAILED DESCRIPTION OF THE PREFERRED EMBODIMENTS

Figure 1:
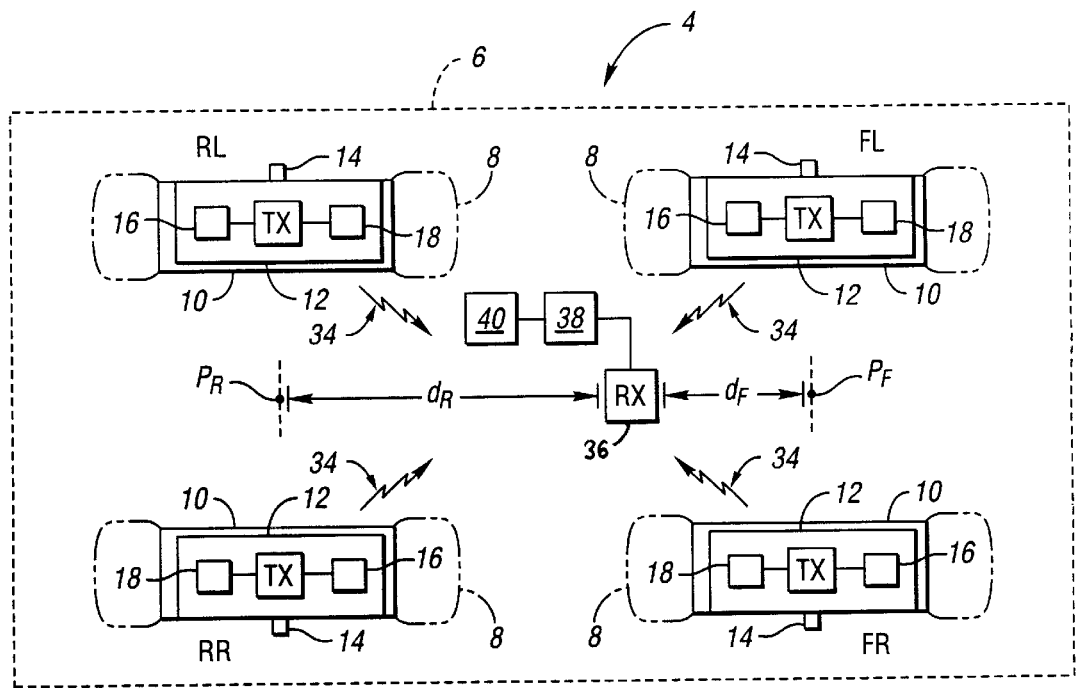
FIG. 1 is a simplified, representative block diagram of the system of the present invention for automatically identifying tire location in a tire pressure monitoring system.

Referring now to the Figures, the preferred embodiments of the present invention will now be described in detail. As previously noted, it is known in the automotive industry to provide for wireless monitoring of vehicle tire parameters, particularly tire pressure. In such tire pressure monitoring systems, tire pressure sensors and radio frequency (RF) transmitters are mounted inside each tire, typically adjacent the inflation valve stem. In each tire, the tire pressure sensed by the tire pressure sensor is transmitted by the transmitter to a receiver/controller located on the vehicle. The tire pressure information delivered to the receiver/controller by the RF signals from the transmitters is subsequently conveyed to a vehicle operator or occupant, typically in the form of a display.

As also previously noted, in order to recognize the particular tire location (e.g., front left (FL), front right (FR), rear left (RL), rear right (RR)) associated with an RF signal received from a tire transmitter, such tire pressure monitoring systems are programmed in an initialization or sign-up operation. That is, to provide a vehicle operator with information specific to each vehicle tire, programming of the tire pressure monitoring system must be undertaken by a technician or vehicle owner so that each RF signal from a tire transmitter will be associated with a particular tire location.

Current tire pressure monitoring systems use a magnetic reed switch in each tire for such programming. More particularly, after the on-board vehicle/controller is placed into a program, initialization, or sign-up mode, the magnetic reed switch in each tire is activated by a technician or vehicle owner using a magnet. Such activation causes the tire transmitter in the tire to transmit a tire pressure signal to the controller the vehicle. In that regard, each pressure sensor and/or transmitter has a unique identification code associated therewith, which identification code is transmitted with the tire pressure signal. Using such identification codes, and by following a preselected sequence for activating each magnetic reed switch, the controller associates each tire pressure signal with a particular tire location.

As noted previously, however, such operation can create problems when tires are subsequently rotated or changed from their initial locations to new locations, or when a tire is replaced. Each time the vehicle tires are rotated or a tire is replaced, initialization or sign-up must be repeated to ensure that the system continues to operate properly by conveying accurate information, including tire location, to the vehicle operator. This initialization requirement makes tire rotation more complex, and increases the possibility of inaccurate operation of the system. Moreover, in the event the magnet for activating the reed switches is misplaced or lost, the tire pressure monitoring system cannot be properly programmed after tire rotation.

Thus, as noted above, there exists a need for an improved system and method for identifying tire locations in a tire pressure monitoring system. The system and method of the present invention overcome the above noted problems by automatically recognizing tire location even after tire rotation or replacement, without the need for subsequent initialization or sign-up operations. The system and method of the present invention also do so easily and simply, without adding significant costs to the tire pressure monitoring system.

Referring now to FIG. 1, a simplified, representative block diagram of the system of the present invention for automatically identifying tire location in a tire pressure monitoring system is shown, denoted generally by reference numeral 4. As seen therein, the system (4) is designed for use in a vehicle (6) having a plurality of tires (8), each tire (8) having a rim (10). Each one of the plurality of tires (8) has a tire location associated therewith, such as front left (FL), front right (FR), rear left (RL), and rear right (RR). It should be noted here that while the present invention is described herein for use in an automotive vehicle having four tires, such an environment is exemplary only. That is, the present invention is suitable for use in any type of vehicle having any number of tires.

Still referring to FIG. 1, the system (4) preferably includes a plurality of tire monitors (12). Each tire monitor (12) is provided for mounting in one of the plurality of tires (8). In that regard, each tire monitor (12) is preferably mounted inside the tire (8) on rim (10) adjacent the tire inflation valve stem (14), although any mounting location known in the art may be used. Each tire monitor (12) preferably includes an appropriate sensor (16) and/or other devices (not shown), for sensing, determining and/or monitoring at least the pressure of the associated tire (8). It should be noted, however, that each tire monitor (12) may also be equipped to sense, determine and/or monitor any number of tire parameters in addition to pressure including, but not limited to, temperature and/or speed, in any fashion well known to those of ordinary skill in the art.

Figure 2:
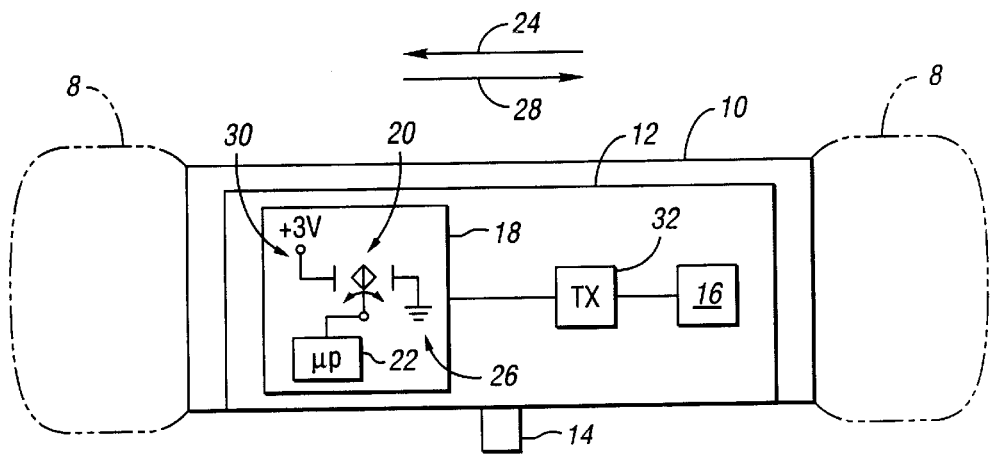
FIG. 2 is a simplified, representative example of a rotation sensor for use in the system and method of the present invention for automatically identifying tire location in a tire pressure monitoring system.

Each tire monitor (12) also preferably includes a rotation sensor (18) for use in determining a direction of rotation of the associated tire (8). In that regard, FIG. 2 depicts a simplified, representative example of a rotation sensor (18) for use in the present invention. As seen therein, tire monitor (12) is mounted to rim (10) of tire (8) adjacent valve stem (14), and includes rotation sensor (18). Rotation sensor (18) includes a moveable switch mechanism (20), which is provided in communication with a microprocessor (22). In that regard, when tire (8) rotates in the direction of arrow (24), switch (20) will contact ground connector (26). Similarly, when tire (8) rotates in the opposite direction of arrow (28), switch (20) will contact three volt (3V) connector (30).

Referring again to FIG. 1, as is readily apparent to those of ordinary skill in the art, tires (8) on the right side of vehicle (6) (i.e., RF and RR tires (8)) rotate in the opposite direction of tires (8) on the left side of the vehicle (6) (i.e., LF and LR tires (8)). As will be described in greater detail below, such opposite rotation, and the detection of such opposite rotation by rotation sensors (18) is used according to the present invention for the purposes of automatic recognition of tire locations.

Still referring to FIG. 1, each tire monitor (12) also includes a transmitter (32) in communication with pressure sensor (16) and rotation sensor (18). Transmitters (32) transmit tire information signals (34) to convey pressure data and rotation direction data for each tire (8). In that regard, tire information signals (34) are preferably a radio frequency (RF) signals, although other signal types known in the art could be employed. Once again, it should be noted that transmitters (32) may also transmit, as part of or separate from tire information signal (32), a signal or signals including data concerning any of a number of other tire parameters in addition to pressure and rotation direction, such as temperature and/or speed as sensed, measured and/or determined by an appropriately equipped tire monitor (12).

It should also be noted that each tire monitor (12) typically includes a battery (not shown), and that transmitters

(32) may also transmit, again as part of or separate from tire information signal (34), a signal or signals representative of the status of such a battery, including a low batter status. As will be described in greater detail below, information concerning at least tire pressure and location, together with information concerning any other tire and/or battery parameters, is ultimately conveyed to a vehicle operator (not shown), typically via a visual display, although audible means such as tones or speech may also be used.

Referring still to FIG. 1, the tire pressure monitoring system (4) of the present invention also includes a receiver (36) for mounting on the vehicle (6) for receiving the tire information signals (34) transmitted by transmitters (32). In that regard, receiver (36) comprises one or more antenna (not shown) to be located at one or more selected sites on the vehicle (6).

Still referring to FIG. 1, the system (4) of the present invention further comprises a controller (38) for mounting on vehicle (6) and to be provided in communication with receiver (36). Controller (38) is for processing tire information signals (34) received by receiver (36) from transmitters (32) for use in automatically identifying the tire location associated with each tire information signal (34). Controller (38), which preferably comprises an appropriately programmed microprocessor or DSP, is also for generating control signals (not shown) for use in conveying at least tire pressure and tire location information to a vehicle operator. It should also be noted that receiver (36) and controller (38) may be part of a single control unit for mounting on vehicle (6).

In that regard, the system (4) may further include a display unit (40) for mounting inside the vehicle (6), the display unit (40) for use by the controller (38) in conveying information, such as at least tire pressure and location, to the vehicle operator (not shown). Display unit (40) may comprise an LED display or a lighted icon in the vehicle dashboard or a vehicle console although, once again, although audible means such as tones or speech may also be used. As described above, information concerning other tire parameters, such as temperature, speed and/or battery status, may also be conveyed to the vehicle operator. It should be noted that the information conveyed to the vehicle operator may include a warning, which may also be audible, if tire pressure, or other tire parameters, such as temperature, and/or battery status are outside recommended ranges.

Still referring to FIG. 1, each sensor (16, 18) and/or transmitter (32) preferably has a unique identification code associated therewith. Such identification codes serve to particularly associate sensors (16, 18) and/or transmitters (32) with vehicle (6). As a result, as described in greater detail below, such identification codes can facilitate identifying, confirming or verifying tire location information. In that regard, each transmitter (32) also preferably transmits such identification code for receipt by receiver (36) and for use by controller (38) in determining that the tire information signals (34) received by receiver (36) are associated with the vehicle (6). Transmitters (34) may transmit the identification codes as part of tire information signal (34), or as a separate signal (not shown). In such a fashion, controller (38) disregards any tire information signals which may be transmitted from any nearby vehicle and received by receiver (36).

Referring still to FIG. 1, receiver (36) is positioned in vehicle (6) at a location having a first distance $(d_F)$ from the front tires (8) (FL and FR), and a second distance $(d_R)$ from the rear tires (8) (RL and RR), where the first distance is different from the second distance. In that regard, as seen in FIG. 1, the first distance $(d_F)$ from the front tires (8) (FL and FR) may be measured from some arbitrary front point $(P_F)$, such as the mid-point between front tires (8) (FL and FR). Alternatively, the first distance $(d_F)$ from the front tires (8) (FL and FR) could be an average of the distances of each of the front tires (8) (FL and FR) from receiver (36). Similarly, as also seen in FIG. 1, the second distance $(d_R)$ from the rear tires (8) (RL and RR) may be measured from some arbitrary rear point $(P_R)$, such as the mid-point between rear tires (8) (RL and RR). Alternatively, the second distance $(d_R)$ from the rear tires (8) (RL and RR) could be an average of the distances of each of the rear tires (8) (RL and RR) from receiver (36). In any event, as previously noted, the first distance $(d_F)$ and the second distance $(d_R)$ are different, where the first distance $(d_F)$ may be less than or greater than the second distance $(d_R)$.

In that regard, controller (38) also preferably comprises a Received Signal Strength Indicator (RSSI) (not shown). Using the RSSI, for each tire information signal (34) received by receiver (36), controller (38) determines whether the pressure data conveyed by that tire information signal (34) is associated with a front tire (8) (FL or FR) or a rear tire (8) (RL or RR) based on the strength of that signal. That is, because receiver (36), as shown in FIG. 1, is positioned in vehicle (6) at a location relatively closer to front tires (8) (FL and FR) than to rear tires (8) (RR and RR), a tire information signal (34) from either of front tires (8) (FL or FR) will have a relatively higher signal strength (as indicated by the RSSI), while a tire information signal (34) from either of rear tires (8) (RL or RR) will have a relatively lower signal strength (as indicated by the RSSI).

As previously described, tire pressure data conveyed by a tire information signal (34) has tire rotation direction data associated therewith. That is, rotation direction data and pressure data from the same tire (8) may be characterized as associated. In that regard, it should be noted that the pressure data and the associated rotation direction data may be transmitted together as part of a single tire information signal (34). Alternatively, however, the pressure data and the associated rotation direction data may be transmitted as separate tire information signals (34). In that event, the previously described unique identification code associated with pressure sensors (16) and/or transmitters (32) may be transmitted with both the pressure data and the rotation direction data for a particular tire (8) as part of the separate tire information signals (34). In such a fashion, the pressure data and the rotation direction data may be properly associated by controller (38) for use in determining tire locations.

In any event, as described in detail above in connection with FIG. 2, depending upon the direction in which a tire (8) rotates, rotation sensor (18) will generate a different output and/or have a different status. As previously noted, as is well known to those of ordinary skill in the art, tires (8) on the right side of vehicle (6) (RF and RR) rotate in the opposite direction to tires (8) on the left side of vehicle (6) (LF and LR). As a result, the different output or status from rotation sensors (18) depending upon the direction in which a tire (8) rotates can be used in determining tire location. In that regard, in the system (4) of the present invention, controller (38) determines whether pressure data conveyed by a tire information signal (34) is associated with a right tire (8) (RF or RR) or a left tire (8) (LF or LR) based on the rotation direction data from rotation sensor (18) conveyed by tire information signals (34). Having done so, and having determined whether the associated pressure data conveyed by the tire information signal (34) is associated with a front tire (8) (FL or FR) or a rear tire (8) (RL or RR) as described above, controller (38) has thereby identified a particular tire location (FL, FR, RL or RR) associated with pressure data conveyed by the tire information signal (34).

As previously described, each sensor (16, 18) and/or transmitter (32) has a unique identification code associated therewith, which identification code is transmitted with the tire information signal (34). As a result, after determining tire locations in the fashion described in detail above, controller (38) can associate each unique identification code with a particular tire location (e.g., front left (FL), front right (FR), rear left (RL), rear right (RR). Thereafter, controller (38) can correctly identify a tire location associated with any tire information signal (34) received based simply on the accompanying identification code, without determining tire locations in the fashion described in detail above. Moreover, controller (38) can also subsequently verify tire location information by again determining tire locations in the fashion described above in order to confirm that the tire information signals (34) received at controller (38) have the identification codes expected. It should also be noted that transmitters (32) may be configured to transmit tire information signals (32) according to any desired schedule (e.g., transmitting only when rotation sensors (18) indicate that tires (8) are rotating, and thus that the vehicle (6) is in motion).

Figure 3:
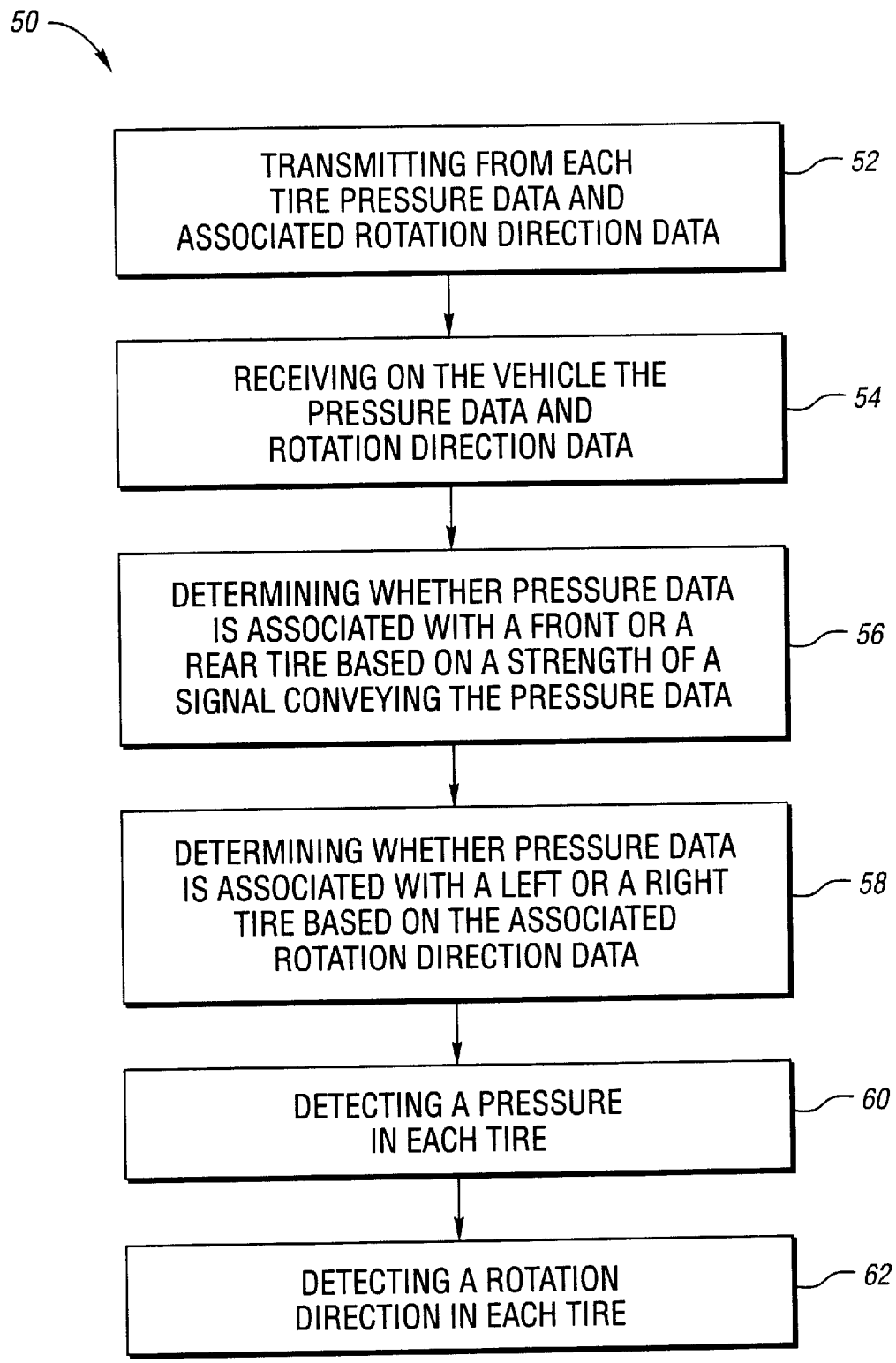
FIG. 3 is a simplified, representative flowchart of the method of the present invention for automatically identifying tire location in a tire pressure monitoring system.

Referring next to FIG. 3, a simplified, representative flowchart of the method of the present invention for automatically identifying tire location in a tire pressure monitoring system is shown, denoted generally by reference numeral 50. The method (50) is for use in a system for remote monitoring of tire pressure in a vehicle having front tires comprising a right tire and a left tire, and rear tires comprising a right tire and a left tire, and the method (50) is for automatically identifying tire location.

In that regard, as seen in FIG. 3, the method (50) comprises transmitting (52) from each tire pressure data and rotation direction data associated therewith, and receiving (54) at a selected location on the vehicle the pressure data and rotation direction data. The method (50) further comprises determining (56) whether pressure data is associated with a front tire or a rear tire based on a strength of a signal conveying the pressure data, and determining (58) whether pressure data is associated with a right tire or a left tire based on the associated rotation direction data.

The method (50) may still further comprise detecting (60) a pressure in each tire, and detecting (62) a rotation direction in each tire. In that regard, according to the method (50) of the present invention, and as previously described in detail in connection with FIG. 1, a plurality of tire monitors are preferably provided, each tire monitor for mounting in one of the tires and comprising a pressure sensor for detecting pressure, a rotation sensor for detecting rotation direction, and a transmitter in communication with the pressure sensor and the rotation sensor for transmitting pressure data and rotation direction data. In that regard, pressure data and associated rotation direction data may be conveyed by a single signal, or as part of separate signals.

Also according to the method (50), a receiver is preferably provided for receiving pressure data and rotation direction data, the receiver for mounting on the vehicle at a location having a first distance from the front tires and a second distance from the rear tires, the first distance different from the second distance. In that regard the first distance may be greater or less than the second distance.

Still further according to the method (50) of the present invention, and as described above in connection with FIG. 1, a controller is preferably provided for mounting on the vehicle and to be provided in communication with the receiver. The controller is for determining whether pressure data is associated with a front tire or a rear tire based on the strength of a signal conveying the pressure data. The controller is also for determining whether pressure data is associated with a right tire or a left tire based on the associated rotation direction data.

As also described above in connection with FIG. 1, according to the method (50) of the present invention, each transmitter provided preferably has a unique identification associated therewith, and each transmitter is also for transmitting the associated identification for use in determining a tire location in the fashion previously described. In that regard, the transmitted identification is also for use to determine whether tire pressure data is associated with the vehicle as also previously described.

It should be noted that the simplified flowchart depicted in FIG. 3 is exemplary of the method (50) of the present invention. In that regard, the method (50) may be executed in sequences other than those shown in FIG. 3, including the execution of a subset of the steps shown and/or the execution of one or more steps simultaneously.

As previously noted, after programming, prior art tire pressure monitoring systems show a vehicle operator which tire is outside appropriate operating parameters by displaying, preferably on an instrument panel, the particular location of that tire. This means, however, that the monitoring system has been appropriately programmed to properly indicate the correct location. As is readily apparent, the present invention overcomes this problem. That is, according to the present invention, the correct tire and tire location will always be identified automatically, without the need for programming the tire pressure monitoring system, or for re-programming the system after tires are rotated or replaced.

From the foregoing description, it can be seen that the present invention provides an improved system and method for identifying tire locations in a tire pressure monitoring system. The system and method of the present invention provide for automatic recognition of tire location even after tire rotation or replacement, without the need for subsequent initialization or sign-up operations. The system and method of the present invention also do so easily and simply, without adding significant costs to the tire pressure monitoring system.

While various embodiments of the invention have been illustrated and described, it is not intended that these embodiments illustrate and describe all possible forms of the present invention. Rather, the words used in the specification are words of description rather than limitation, and it is understood that various changes may be made without departing from the spirit and scope of the invention. Indeed, many alternatives, modifications, and variations will be apparent to those skilled in the art in light of the foregoing description, and the present invention is intended to embrace all such alternatives.

What is claimed is:

1. In a system for remote monitoring of tire pressure in a vehicle having front tires comprising a right tire and a left tire, and rear tires comprising a right tire and a left tire, a system for automatically identifying tire location comprising:

a plurality of transmitters, each transmitter for mounting in one of the tires, each transmitter for transmitting tire information signals conveying tire pressure data and tire rotation direction data associated therewith;

a receiver for receiving the tire information signals transmitted by the transmitters, the receiver for mounting on the vehicle at a location having a first distance from the front tires and a second distance from the rear tires, the first distance different from the second distance; and a controller for mounting on the vehicle and to be provided in communication with the receiver, the controller for determining whether pressure data conveyed by a tire information signal is associated with a front tire or a rear tire based on a strength of the signal, and for determining whether pressure data conveyed by a tire information signal is associated with a right tire or a left tire based on the associated rotation direction data.

2. The system of claim 1 further comprising:

a plurality of pressure sensors for sensing tire pressure, each pressure sensor for mounting in one of the tires and to be provided in communication with a transmitter; and a plurality of rotation sensors for sensing tire rotation direction, each rotation sensor for mounting in one of the tires and to be provided in communication with a transmitter.

3. The system of claim 2 wherein a transmitter, a pressure sensor, and a rotation sensor together comprise a tire monitor, the tire monitor for mounting in one of the tires.

4. The system of claim 1 wherein the first distance is greater than the second distance.

5. The system of claim 1 wherein the first distance is less than the second distance.

6. The system of claim 1 wherein a single tire information signal conveys both the pressure data and the associated rotation direction data.

7. The system of claim 1 wherein the receiver and controller together comprise a control unit for mounting on the vehicle.

8. The system of claim 1 wherein each transmitter has an identification associated therewith, and each transmitter is also for transmitting the associated identification for receipt by the receiver and for use by the controller in determining a tire location.

9. The system of claim 8 wherein the transmitted identification is also for use by the controller to determine whether tire pressure data conveyed by a tire information signal is associated with the vehicle.

10. The system of claim 1 further comprising a display for mounting in the vehicle, the display for use by the controller to convey tire pressure and location information to a user.

11. In a system for remote monitoring of tire pressure in a vehicle having front tires comprising a right tire and a left tire, and rear tires comprising a right tire and a left tire, a method for automatically identifying tire location comprising:

transmitting from each tire pressure data and rotation direction data associated therewith;

receiving at a selected location on the vehicle the pressure data and rotation direction data;

determining whether pressure data is associated with a front tire or a rear tire based on a strength of a signal conveying the pressure data; and determining whether pressure data is associated with a right tire or a left tire based on the associated rotation direction data.

12. The method of claim 11 further comprising:

detecting a pressure in each tire; and detecting a rotation direction in each tire.

13. The method of claim 12 wherein a plurality of tire monitors are provided, each tire monitor for mounting in one of the tires and comprising a pressure sensor for detecting pressure, a rotation sensor for detecting rotation direction, and a transmitter in communication with the pressure sensor and the rotation sensor for transmitting pressure data and rotation direction data.

14. The method of claim 13 wherein each transmitter has an identification associated therewith, and each transmitter is also for transmitting the associated identification for use in determining a tire location.

15. The method of claim 14 wherein the transmitted identification is also for use to determine whether tire pressure data is associated with the vehicle.

16. The method of claim 11 wherein a receiver is provided receiving pressure data and rotation direction, the receiver for mounting on the vehicle at a location having a first distance from the front tires and a second distance from the rear tires, the first distance different from the second distance.

17. The method of claim 16 wherein the first distance is greater than the second distance.

18. The method of claim 16 wherein the first distance is less than the second distance.

19. The method of claim 16 wherein a controller is provided for determining whether pressure data is associated with a front tire or a rear tire based on a strength of a signal conveying the pressure data and whether pressure data is associated with a right tire or a left tire based on the associated rotation direction data, the controller for mounting on the vehicle and to be provided in communication with the receiver.

20. The method of claim 11 wherein pressure data and associated rotation direction data are conveyed by a single signal.

* * * * *